(12) United States Patent
Quax et al.

(10) Patent No.: US 12,040,357 B2
(45) Date of Patent: Jul. 16, 2024

(54) INTEGRATED CIRCUIT WITH GUARD REGION AND DIODE CIRCUIT

(71) Applicant: NXP B.V., Eindhoven (NL)

(72) Inventors: Guido Wouter Willem Quax, Wijchen (NL); Dongyong Zhu, Shanghai (CN)

(73) Assignee: NXP B.V., Eindhoven (NL)

( * ) Notice: Subject to any disclaimer, the term of this patent is extended or adjusted under 35 U.S.C. 154(b) by 187 days.

(21) Appl. No.: 17/473,167

(22) Filed: Sep. 13, 2021

(65) Prior Publication Data
US 2022/0085156 A1    Mar. 17, 2022

(30) Foreign Application Priority Data

Sep. 15, 2020 (CN) .......................... 202010966141.4

(51) Int. Cl.
    *H01L 29/06*     (2006.01)
    *H01L 27/02*     (2006.01)
    *H01L 27/092*     (2006.01)

(52) U.S. Cl.
CPC ...... *H01L 29/0623* (2013.01); *H01L 27/0255* (2013.01); *H01L 27/0259* (2013.01); *H01L 27/0266* (2013.01); *H01L 27/0296* (2013.01); *H01L 27/0921* (2013.01)

(58) Field of Classification Search
CPC ............. H01L 27/0255; H01L 29/0623; H01L 27/0296; H01L 27/0921
See application file for complete search history.

(56) References Cited

U.S. PATENT DOCUMENTS

| | | | |
|---|---|---|---|
| 7,348,643 B2 | 3/2008 | Boselli et al. | |
| 8,587,071 B2 | 11/2013 | Tsai et al. | |
| 8,754,474 B2 | 6/2014 | Ko | |
| 2003/0039084 A1* | 2/2003 | Hatzilambrou | ..... H01L 27/0255 361/56 |
| 2012/0126322 A1* | 5/2012 | Ko | ....................... H01L 29/1083 257/E29.256 |
| 2019/0244953 A1* | 8/2019 | Langguth | ............ H01L 27/0255 |

OTHER PUBLICATIONS

Tsai, H., "Active Guard Ring to Improve Latch-Up Immunity", IEEE Transactions on Electron Devices, vol. 61, No. 12, Dec. 2014.

* cited by examiner

*Primary Examiner* — Tucker J Wright
(74) *Attorney, Agent, or Firm* — David G. Dolezal

(57) ABSTRACT

As disclosed herein, an integrated circuit substrate includes a first region coupled to a signal terminal and includes a guard region coupled via a diode circuit to a supply voltage terminal of the integrated circuit. The first region and the guard region are both of a first conductivity type. A cathode of the diode circuit is connected to the guard region and an anode of the diode circuit is connected to the supply voltage terminal. The first region and the guard region are separated by at least by a second region of the substrate that is of a second conductivity type opposite the first conductivity type.

16 Claims, 8 Drawing Sheets

INTEGRATED CIRCUIT WITH GUARD REGION AND DIODE CIRCUIT

CROSS-REFERENCE TO RELATED APPLICATIONS

This application claims the priority under 35 U.S.C. § 119 of China application no. 202010966141.4, filed on 15 Sep. 2020, the contents of which are incorporated by reference herein.

BACKGROUND OF THE INVENTION

Field of the Invention

This invention relates to integrated circuits with guard regions.

Description of the Related Art

Some integrated circuits utilized guard regions for providing electrical isolation between devices located in the integrated circuit. A guard region is a semiconductor region in an integrated circuit substrate that is utilized to suppress carriers (holes, electrons) from flowing between opposites sides of the guard region in the substrate.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, an integrated circuit substrate includes a first region coupled to a signal terminal and includes a guard region coupled via a diode circuit to a supply voltage terminal of the integrated circuit. The first region and the guard region are both of a first conductivity type. A cathode of the diode circuit is connected to the guard region and an anode of the diode circuit is connected to the supply voltage terminal. The first region and the guard region are separated by at least a second region of the substrate that is of a second conductivity type opposite the first conductivity type.

One advantage of such a configuration with a diode circuit is that it may block currents from flowing through a parasitic bipolar transistor in the substrate during an ESD event on the signal terminal and yet still allow for the supply voltage terminal and guard region to provide current during a latch up test when the substrate is subject to a negative current stress.

Figure 1:
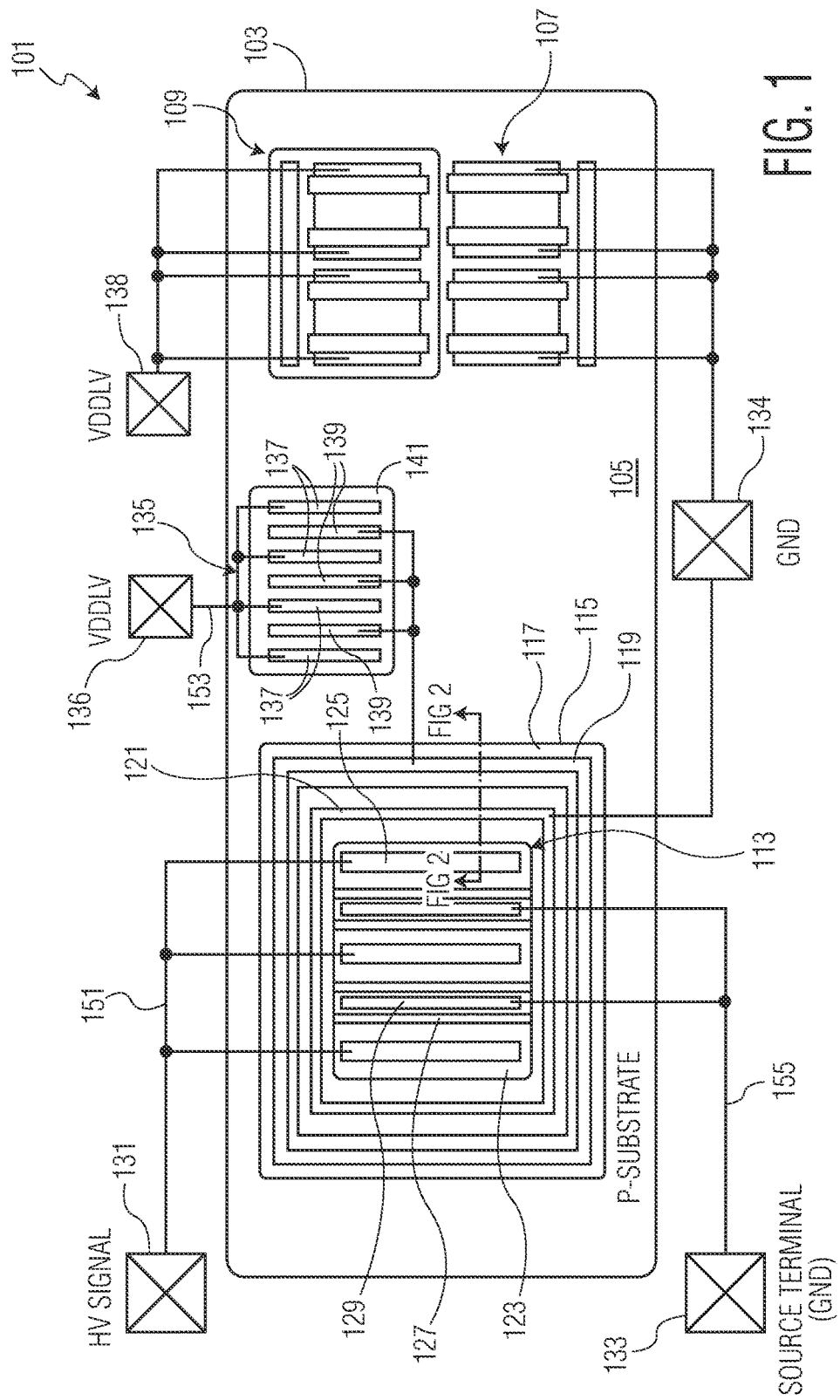
FIG. 1 is a top view of an integrated circuit substrate according to one embodiment of the present invention.

FIG. 1 is a top view showing substrate 103 of integrated circuit 101. Substrate 103 is made of semiconductor material (e.g. silicon, silicon germanium, silicon carbide, gallium nitride, gallium arsenide, or other III-V semiconductor materials). Substrate 103 may have a bulk semiconductor configuration or semiconductor on insulator (SOI) configuration with a buried dielectric layer (not shown). Substrate 103 includes a number of regions that are doped with conductivity dopants to implement semiconductor devices (e.g. transistors, diodes). Examples of doped regions include P-type guard region 121 and N-type well 123. A semiconductor region is characterized as N-type if it has a net conductivity doping profile of N-type dopants (e.g. phosphorous, arsenic) and is characterized as P-type if it has a net conductivity doping profile of P-type dopants (e.g. boron). Substrate 103 may also include insulative structures (not shown) that are made of an insulative material (e.g. silicon dioxide) that is grown or formed on substrate 103 for electrical isolation.

Integrated circuit 101 includes conductive structures located on top of substrate 103 such as doped polysilicon gate structures (127), interconnects (153) located in interconnect layers (not shown) of integrated circuit 101, and external terminals (131, 133) for conveying power supply voltages (VDD, VDDLV, GND) and signals between the devices of integrated circuit 101 and external sources. The interconnects may include vias located between the interconnect layers. In one embodiment, the external terminals are contact pads, but may be other conductive structures such as bumps, pins, or posts in other embodiments. Integrated circuit 101 may be packaged in a semiconductor package with encapsulant material (e.g. molding compound, plastic resin—not shown), either by itself or with other integrated circuits. With such packaging, the terminals (131, 134) of the integrated circuit would be coupled to external terminals such as pins, leads, contact pads (not shown) of the semiconductor package.

Integrated circuit 101 includes a number of devices with semiconductor regions implemented in substrate 103. Transistor 113 is an NMOS transistor with N-type drain contact regions 125 implemented in N-well 123. The drain contact regions 125 are tied to a signal terminal 131 via interconnect 151. Transistor 113 includes N-type source regions 129 that are connected by interconnect 155 to a source terminal 133, which in the embodiment shown is a ground terminal. Transistor 113 includes poly gate structures 127 that are located over substrate 103. The channel regions are located in a P-well (not shown) located beneath the gate structures 127.

Substrate 103 includes a P-type guard region 121 that surrounds transistor 113 and is tied to ground terminal 134. Substrate 103 includes an N-type guard region 115 that surrounds region 121 and transistor 113. Guard region 115 includes a lighter doped N-type region 117 and a heavier doped N-type contact region 119.

Substrate 103 also includes a diode 135 with N-type contact regions 139 located in N-well 141 which serves as the cathode and P-type regions 137 which serve as the anode and are connected to terminal 136 with interconnect 153. Substrate 103 also includes a PMOS transistor 109 and an NMOS transistor 107. Regions of substrate 103 may be silicided at locations where they contact an interconnect.

In the embodiment shown, transistor 113 is characterized as a higher voltage device than transistors 109 and 107. In one example, signal terminal 131 is configured to receive a signal having a voltage ranging from 0-25 volts. Transistors 109 and 107 are characterized as lower voltage devices where a maximum voltage applied to the terminals of these devices is less (e.g. 3.6 Volts). In the embodiment shown, power supply terminal VDDLV may be configured to provide a supply voltage of 3.6V. However, these voltages may be of other values in other embodiments. In the embodiment shown, power supply terminal VDDLV may be configured to provide a supply voltage of 3.6V. In some embodiments, a different lower supply voltage may be applied to terminal 138 than terminal 136. In one embodiment, signal terminal 131 is configured to received and/or provide an analog signal. In other embodiments, terminal 131 may be configured to receive and/or provide a digital signal. In one embodiment, the area inside guard region 115 may be characterized as a voltage domain of a higher voltage than the voltage domain of transistors 107 and 109.

Guard regions 115 and 121 provide electrical isolation to prevent the migration of carries in P-type well 105 between the high voltage devices (e.g. transistor 113) and the low voltage devices (e.g. transistors 109 and 107 and diode 135). Although in the embodiment shown, guard regions 121 and 115 are shown as rings, in other embodiments, they may have other forms. For example, in other embodiments, the guard regions do not surround the high voltage region (e.g. the region of transistor 113). In one example, the guard regions may extend from one edge of substrate 103 to another edge of substrate 103 to separate the different voltage domains in the substrate. In some embodiments, the guard regions may extend between deep isolation trenches (not shown) in substrate 103. In other embodiments, the guard regions may surround the lower voltage devices.

In other embodiments, substrate 103 may include a different number of high voltage devices and a different number of low voltage devices. For example, guard regions 115 and 119 may separate a larger number of higher voltage transistors from a larger number of low voltage devices.

In one embodiment, the different semiconductor regions may be formed by selectively implanting the regions through patterned masks (not shown) with ion implantation processes at prescribed dopant dosages and energies to obtain the desired doping concentrations at the desired locations and depths of substrate 103. In some embodiments, substrate 103 may be blanket doped with P-type dopants to obtain the desired P-type conductivity level for well 105. In other embodiments, substrate 103 may be in-situ doped with P-type dopants such as grown in a silicon ingot or formed by an epitaxial process.

In one embodiment, integrated circuit 101 may be utilized as a high voltage switch e.g. for automotive or consumer electronic applications. For example, integrated circuit 101 may be used to control the gate net of an external FET which acts as a large switch. However, in other embodiments, it may be implemented for other applications in other systems e.g. a wireless communication device.

Figure 2:
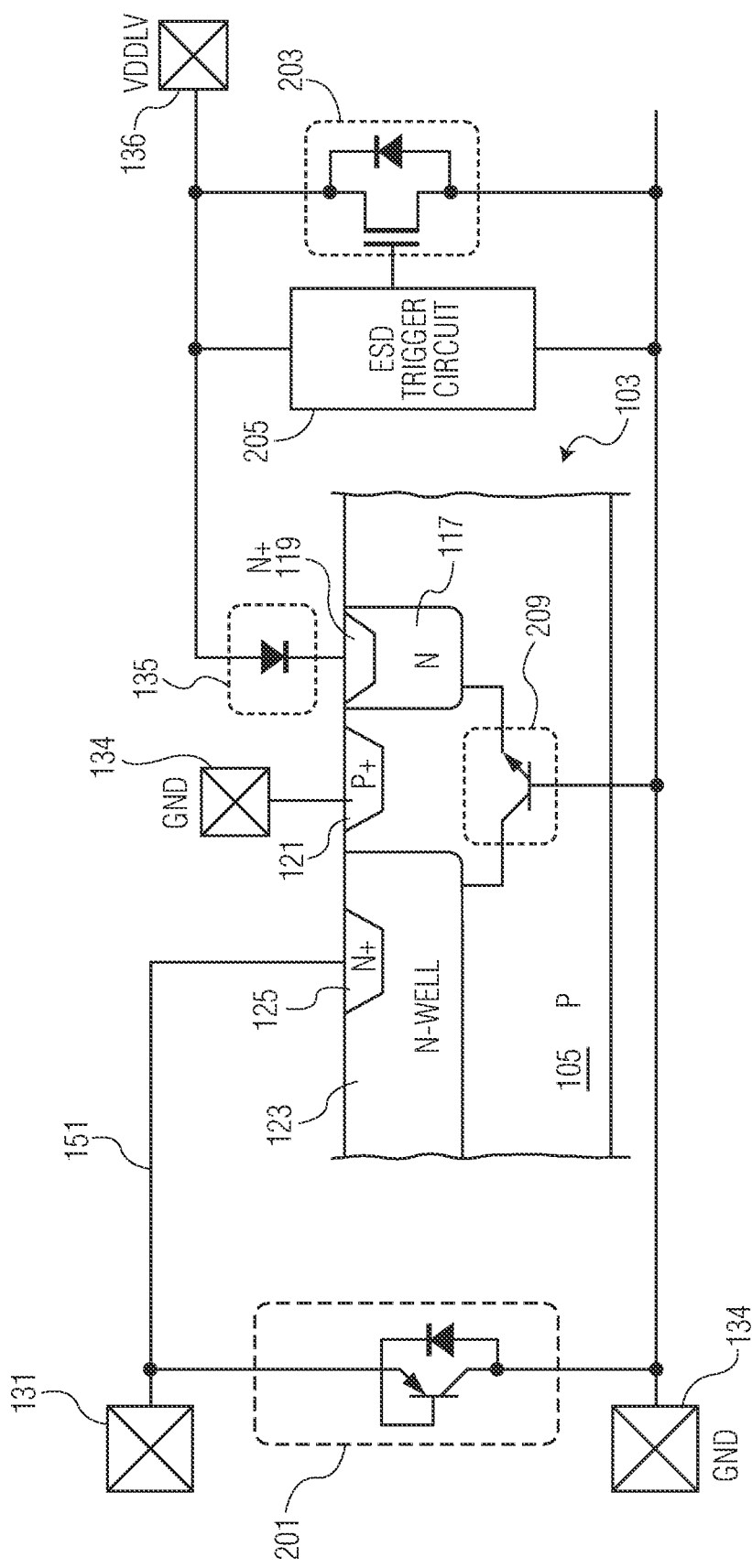
FIG. 2 is a partial cutaway side view of an integrated circuit substrate during an operating condition according to one embodiment of the invention.

FIG. 2 is a partial cutaway side view of substrate 103. Integrated circuit 101 includes an Electrostatic Discharge (ESD) clamp 201 for discharging current from terminal 131 during an ESD event. In one embodiment, clamp 201 includes a bipolar transistor and parasitic diode, but may be implemented with other devices in other embodiments. In other embodiments, an ESD trigger circuit (not shown) may be connected to clamp 201 to activate clamp 201 during a detected ESD event. In one embodiment, the devices of clamp 201 are implemented in a high voltage domain region (e.g. in a region surrounded by guard regions 121 and 115) of substrate 103. However, they may be implemented in other regions in other embodiments.

FIG. 2 shows an ESD clamp 203 connected between terminal 136 and ground terminal 134. In the embodiment shown, clamp 203 includes an NMOS transistor and a parasitic diode. However, other ESD clamps may include other devices in other embodiments. Clamp 203 is activated by a trigger circuit 205, which in one embodiment is a circuit that triggers on the rising edge of an ESD pulse. Upon a detection of an ESD event by circuit 205 at terminal 136, clamp 203 closes to discharge the current from the ESD event to ground terminal 134 In one embodiment, the devices of circuit 205 and clamp 203 are located in a low voltage domain of substrate 103, but may be located in other locations in other embodiments.

During an ESD event at terminal 131, the voltage of terminal 131 would be elevated. In response, clamp 201 would close to discharge the ESD current to terminal 134, which would also raise the voltage of terminal 134. In such a condition, a parasitic NPN transistor 209 forms in substrate 103 with well 123 serving as the collector, P-well 105 as the base, and region 117 as the emitter. If integrated circuit 101 did not include diode 135 and if terminal 136 was tied to region 119, then a large current from terminal 131 through parasitic bipolar transistor 209 to terminal 136 during an ESD event could cause damage to regions in substrate 103. Accordingly, placing diode 135 in the path between terminal 136 and region 119 (with its anode connected to terminal 136 and its cathode connected to region 119) acts to block current through parasitic transistor 209 during an ESD event on terminal 131, thereby preventing damage to substrate 103.

Figure 3:
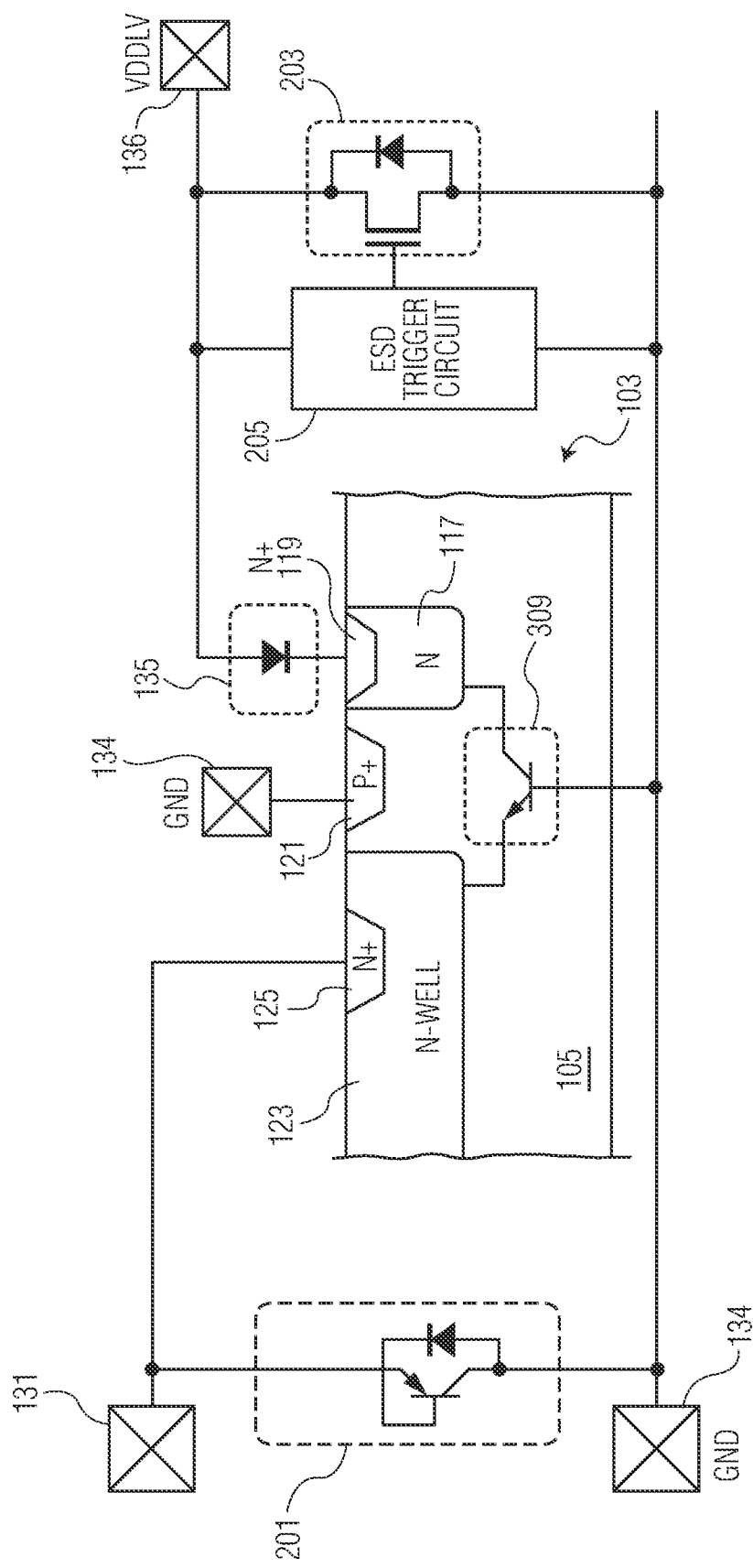
FIG. 3 is a partial cutaway side view of an integrated circuit substrate during another operating condition according to one embodiment of the invention.

FIG. 3 is a partial cutaway sideview of substrate 103 during a negative current injection test at signal terminal 131. A negative current injection test is where a negative voltage is applied to terminal 131 and a current (e.g. −200 mA) is pulled from terminal 131. This test may be performed after manufacture. In one embodiment, the negative current injection test is performed during a latch up test conforming to a JEDEC standard (e.g. JEDEC78E). In one embodiment, the JEDEC test is used to test product robustness during current injection on the signal pins, as well as overvoltage on the supply pins.

During a negative injection test, with the voltage of terminal 131 being at negative voltage, a parasitic NPN transistor 309 forms in substrate 103 where N-well 123 serves as the emitter, P-well region 105 serves as the base, and N-type guard region 117 serves as the collector. The negative voltage on terminal 131 pulls N-well 123 to a voltage below P-well 105 and region 117 which causes a current to conduct from terminal 136 to terminal 131 through parasitic transistor 309 to supply the negative current. Having a diode 135 in series with the guard region 115 allows for current to flow to from terminal 136 to region 117. If such a path from terminal 136 did not exist during the negative current injection test, then the current pulled from terminal 131 would have to be supplied through other devices and terminals (e.g. transistor 107 and 109) in the lower voltage domain region, which may cause latch up and damage to those devices. Thus, such a configuration confines the current from the negative current injection test to the high voltage domain area and guard regions.

Accordingly, in some embodiments, providing a diode circuit coupled in series with a guard region and a supply voltage terminal where the cathode is connected to the guard region and the anode is connected to the supply voltage terminal may provide for an integrated circuit where the guard region can supply current for a negative current injection test so that other regions can be protected from damage and wherein the diode prevents parasitic current from an ESD event from flowing through the guard region, thereby preventing damage to the substrate from the ESD current.

Figure 4:
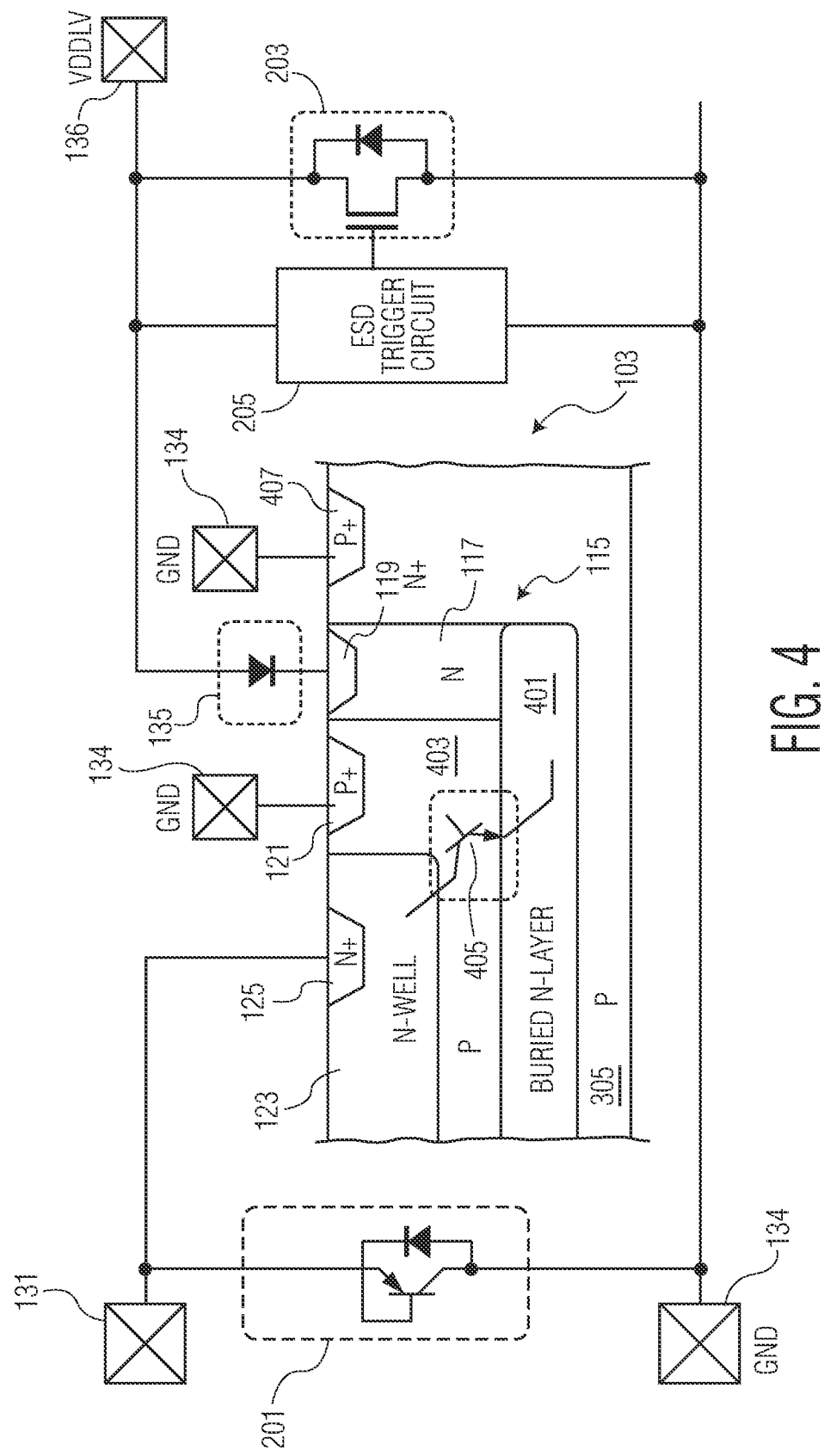
FIG. 4 is a partial cutaway side view of an integrated circuit substrate according to another embodiment of the invention.

FIG. 4 is a partial cutaway view of a substrate according to another embodiment of the present invention. The substrate of FIG. 4 is similar to the substrate of FIG. 2, except that the guard region 115 includes a buried N-type layer 401 located directly below transistor 113. Region 117 extends to layer 401. Other items in FIG. 4 are similar to the items of FIG. 2 having the same reference numbers. In the embodiment of FIG. 4, a P-type contact region 407 is located outside of guard region 115 for grounding P-well 305 with terminal 134. A P-type well 403 is located inside guard region 115 and is formed by the implantation of regions 117, 119, and buried layer 401. In one embodiment, buried layer 401 is formed by the selective implantation of N-type dopants at relatively higher energies to implant the dopants at deeper regions of substrate 103.

During and ESD event on terminal 131, a parasitic NPN transistor 405 forms in substrate 103 with N-well 123 being the collector, P-well 403 being the base, and guard region 115 (buried N layer 401 and region 117) being the emitter. Diode 135 prevents current from flowing through parasitic transistor 405 during an ESD event.

FIGS. 5-8 show other types of diode circuits may be utilized for diode 135 in other embodiments.

Figure 5:
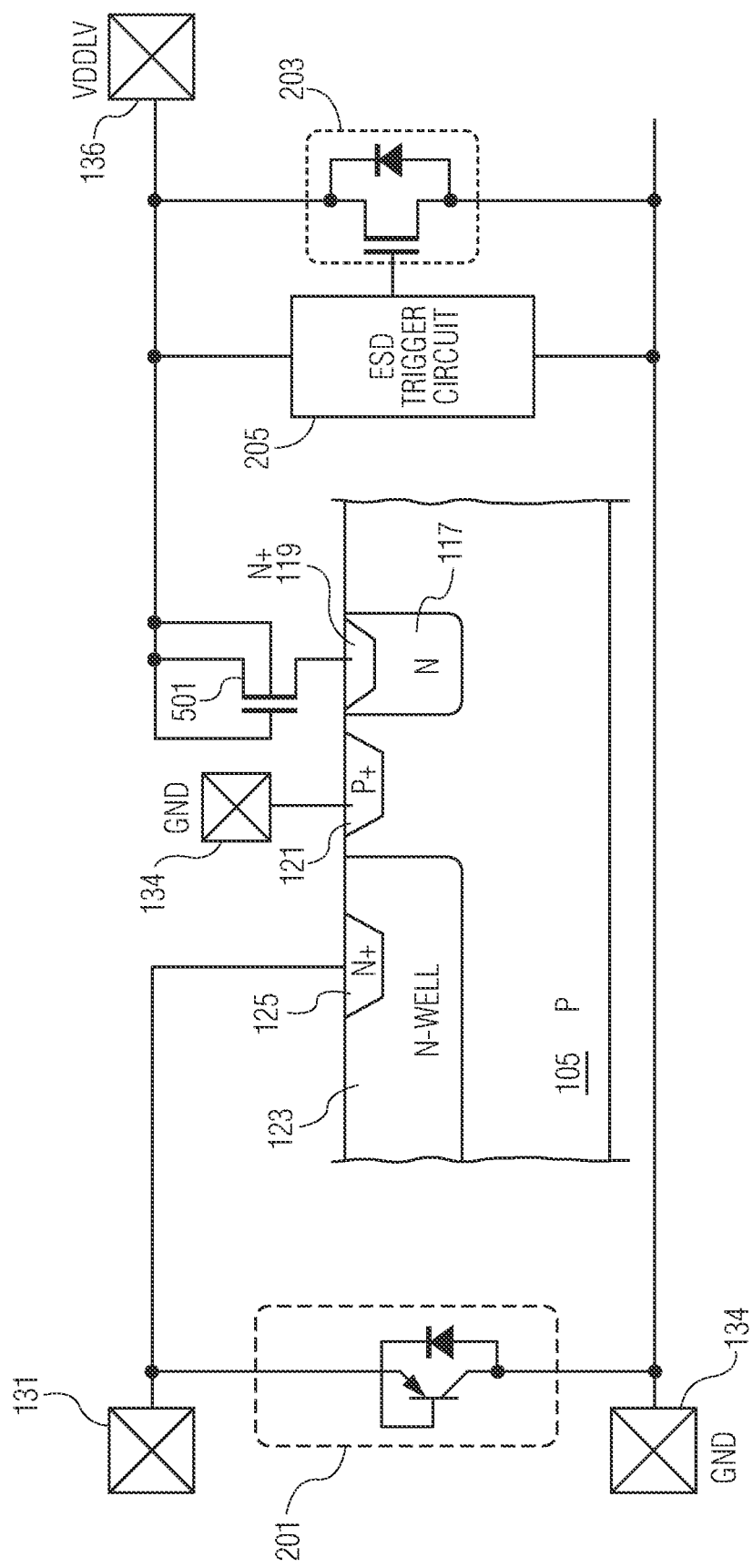
FIG. 5 is a partial cutaway side view of an integrated circuit substrate according to another embodiment of the invention.

FIG. 5 is a partial cutaway view of a substrate according to another embodiment of the present invention. The substrate of FIG. 5 is similar to the substrate of FIG. 2, except that the diode circuit is implemented with a NMOS transistor 501 that has a diode configuration. In the embodiment shown, transistor 501 has a body diode configuration with an isolated body region acting as the anode of the diode. The drain terminal of transistor 501 is connected to contact region 119 and serves as the cathode. The gate and source terminals of transistor 501 are connected to the body region and the VDDLV terminal 136. In one embodiment, transistor 501 is located in a low voltage domain area (e.g. next to transistors 107 and 109), but may be located in other areas in other embodiments Other items in FIG. 5 are similar to the items of FIG. 2 having the same reference numbers.

Figure 6:
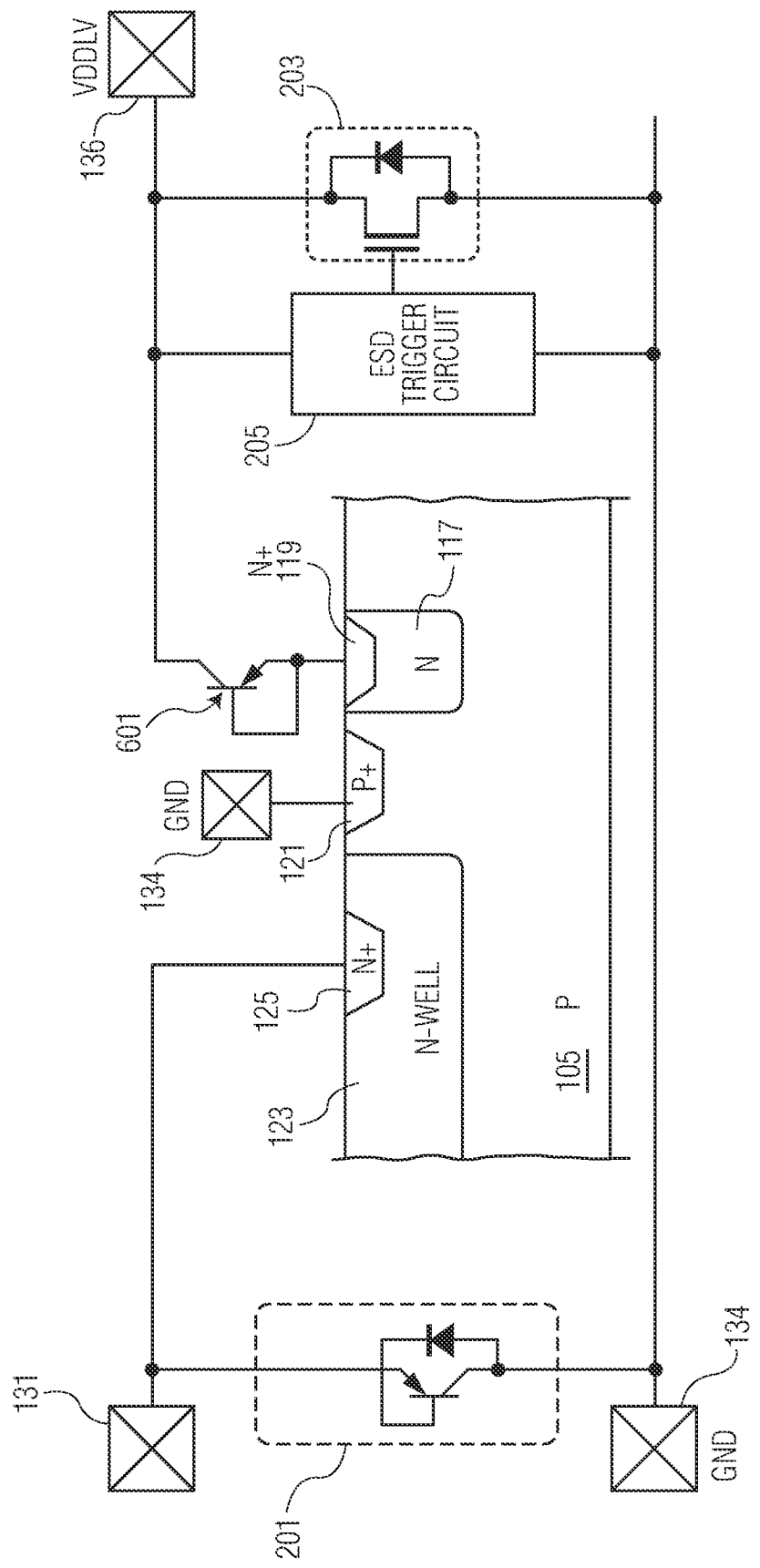
FIG. 6 is a partial cutaway side view of an integrated circuit substrate according to another embodiment of the invention.

FIG. 6 is a partial cutaway side view of a substrate according to another embodiment of the present invention. The substrate of FIG. 6 is similar to the substrate of FIG. 2, except that the diode circuit is implemented with a PNP transistor 601 having a diode configuration. The collector of transistor 601 is connected to terminal 136 and serves as the anode of a diode. The emitter and base of transistor 601 are connected to contact region 119 where the base serves as a cathode for the diode. In one embodiment, transistor 601 is located in a low voltage domain area (e.g. next to transistors 107 and 109), but may be located in other areas in other embodiments. Other items in FIG. 6 are similar to the items of FIG. 2 having the same reference numbers.

Figure 7:
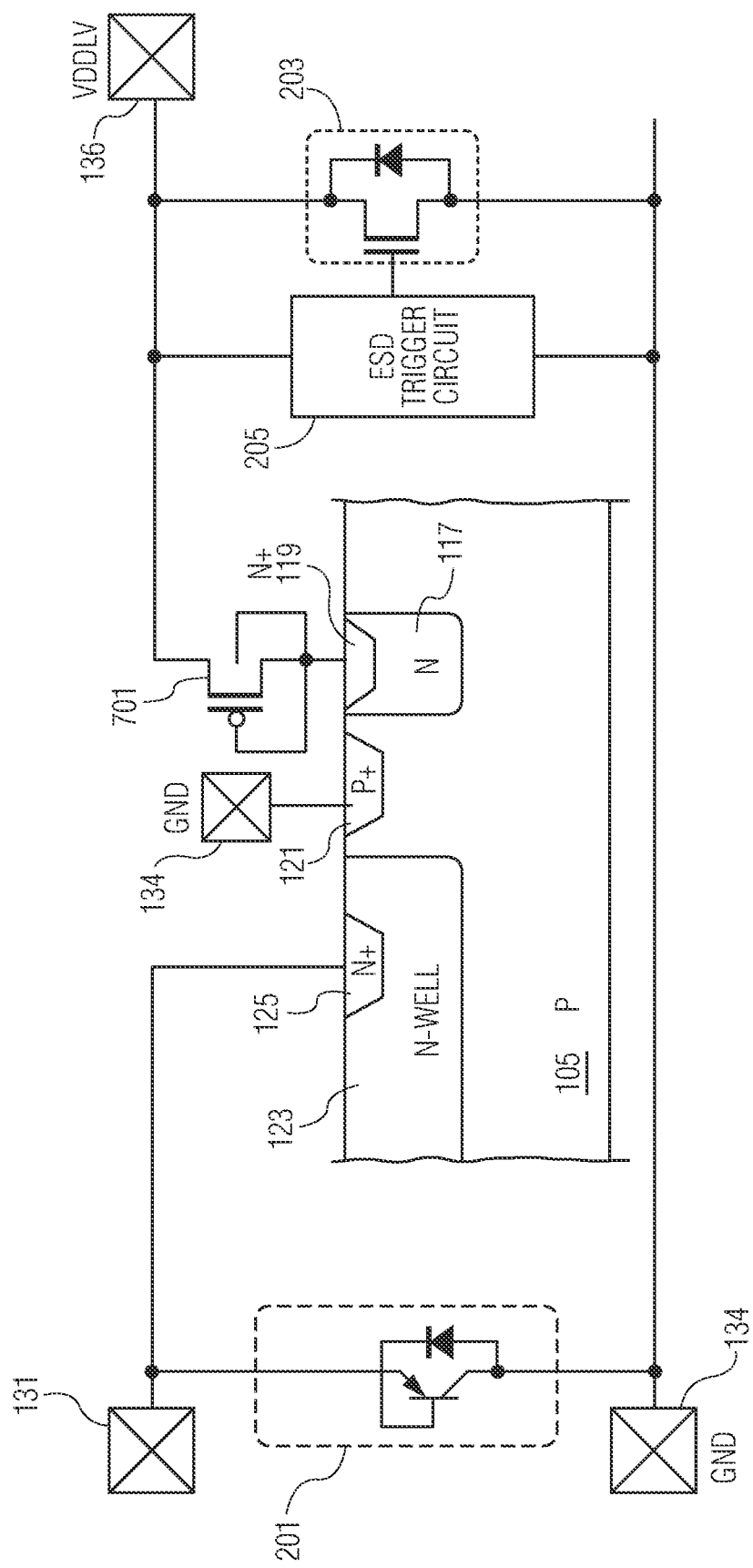
FIG. 7 is a partial cutaway side view of an integrated circuit substrate according to another embodiment of the invention.

FIG. 7 is a partial cutaway side view of a substrate according to another embodiment of the present invention. The substrate of FIG. 7 is similar to the substrate of FIG. 2, except that the diode circuit is implemented with a PMOS transistor 701 that has a diode configuration. In the embodiment shown, transistor 701 has a body diode configuration with the body region acting as the cathode of the diode. The drain terminal of transistor 701 is connected to terminal 136 and serves as the anode. The gate and source terminals of transistor 701 are connected to the body region and region 119. In one embodiment, transistor 701 is located in a low voltage domain area (e.g. next to transistors 107 and 109), but may be located in other areas in other embodiments. Other items in FIG. 7 are similar to the items of FIG. 2 having the same reference numbers.

Figure 8:
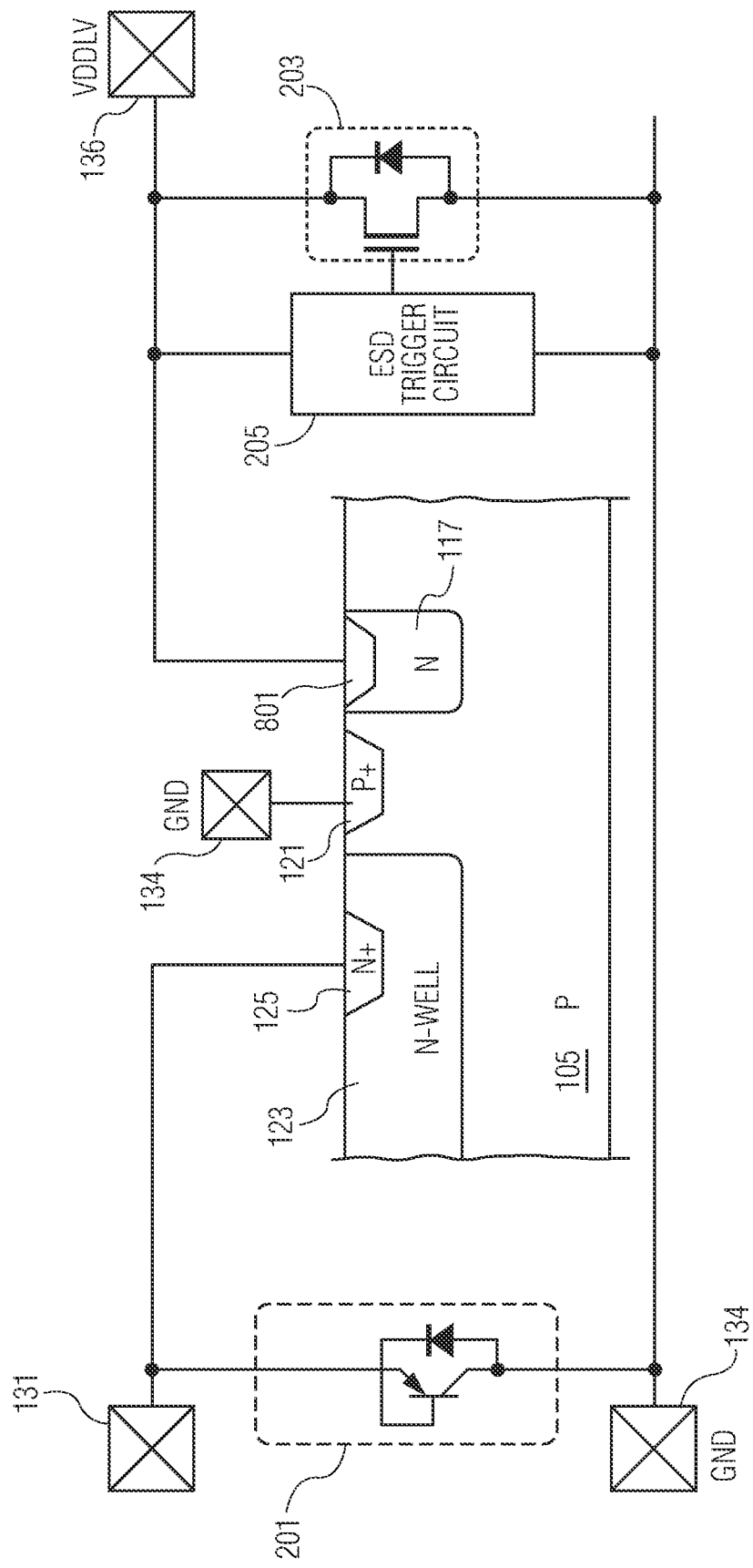
FIG. 8 is a partial cutaway side view of an integrated circuit substrate according to another embodiment of the invention.

FIG. 8 is a partial cutaway side view of a substrate according to another embodiment of the present invention. The substrate of FIG. 8 is similar to the substrate of FIG. 2, except that the diode circuit is implemented with a P-type region 801 formed in guard region 117. The P-type region 801 serves as the anode of the diode circuit and a portion of the N-type region at the junction of region 801 serves as the cathode of the diode circuit. Other items in FIG. 8 are similar to the items of FIG. 2 having the same reference numbers. With this embodiment, the surface area of the die may be reduced in that the diode circuit can be implemented with the shield region.

Other embodiments may have other configurations. For example, although the diode circuit is described as being implemented in substrate 103, in other embodiments, the diode circuit may be located in other places. For example, in some embodiments, the diode circuit may be a discrete part that is located in the package with the integrated circuit 101 or located externally to the package of the integrated system. Also, in other embodiments, guard region 115 may be a P-type guard region where the conductivity of other regions is opposite of what is shown (e.g. well 105 would be an N-type well). Also, in other embodiments, well 123 may be an electrode of a capacitor.

As disclosed herein, a first structure is "directly over" a second structure if the first structure is located over the second structure in a line having a direction that is perpendicular with the generally planar major side of a die. For example, in FIG. 4, N-well 123 is directly over buried layer 401. Region 407 is not directly over buried layer 401. As disclosed herein, a first structure is "directly beneath" a second structure if the first structure is located beneath the second structure in a line having a direction that is perpendicular with the generally planar major side of the die. For example, in FIG. 4, layer 401 is directly beneath well 123. Layer 401 is not directly beneath region 407. One structure is "directly between" two other structures in a line if the two structures are located on opposite sides of the one structure in the line. For example, in FIG. 4, region 121 is located directly between well 123 and region 119 in a line in the cut away side view of FIG. 4. Layer 401 is not located directly between well 123 and region 407 in a line. A first structure is "directly lateral" to a second structure if the first structure and the second structure are located in a line having a direction that is parallel with a generally planar major side of the die. For example, regions 121 and 117 are directly lateral to each other. One structure is "directly laterally between" two other structures if the two structures are located on opposite sides of the one structure in a line that is parallel with a generally planar major side of the die. For example, in FIG. 4, region 121 is located directly laterally between well 123 and region 117.

Features specifically shown or described with respect to one embodiment set forth herein may be implemented in other embodiments set forth herein. For example, a buried layer similar to layer 401 may be implemented with the embodiments of FIGS. 5-8.

In one embodiment, semiconductor circuitry includes a first region of an integrated circuit substrate of a first conductivity type coupled to a signal terminal of an integrated circuit. The integrated circuit substrate being of the integrated circuit. The semiconductor circuitry includes a guard region of the integrated circuit substrate of the first conductivity type coupled via a diode circuit to a supply voltage terminal of the integrated circuit. A cathode of the diode circuit is connected to the guard region and an anode of the diode circuit is connected to the supply voltage terminal. The first region and the guard region are separated by at least by a second region of the integrated circuit substrate that is of a second conductivity type opposite the first conductivity type.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. Semiconductor circuitry comprising:
   a first region of an integrated circuit substrate of a first conductivity type coupled to a signal terminal of an integrated circuit, the integrated circuit substrate being of the integrated circuit;
   a guard region of the integrated circuit substrate of the first conductivity type coupled via a diode circuit to a supply voltage terminal of the integrated circuit;
   wherein a cathode of the diode circuit is connected to the guard region and an anode of the diode circuit is connected to the supply voltage terminal;
   wherein the first region and the guard region are separated by at least a second region of the integrated circuit substrate that is of a second conductivity type opposite the first conductivity type;
   wherein the guard region is physically located in the integrated circuit substrate directly laterally between the first region and a semiconductor device in the integrated circuit substrate;
   wherein the semiconductor device is located in a second voltage domain of the integrated circuit and the first region is located in a first voltage domain of the integrated circuit, wherein the supply voltage terminal is of the second voltage domain;
   wherein the first voltage domain is characterized as a higher voltage domain than the second voltage domain;
   wherein the signal terminal is configured to provide a signal with a higher voltage range than a high supply voltage of the second voltage domain supplied by the supply voltage terminal.

2. The semiconductor circuitry of claim 1 wherein the guard region collects current to protect the semiconductor device during a negative current injection applied to the signal terminal.

3. The semiconductor circuitry of claim 1 wherein the guard region is characterized as a guard ring in the integrated circuit substrate that surrounds the first region.

4. The semiconductor circuitry of claim 1 further comprising a first ESD clamp connected between the signal terminal and a second supply voltage terminal and a second ESD clamp connected between the supply voltage terminal and the second supply voltage terminal.

5. The semiconductor circuitry of claim 4 wherein the second region of the integrated circuit substrate is biased by the second supply voltage terminal.

6. The semiconductor circuitry of claim 1 further comprising a second guard region located at least at a surface of the integrated circuit substrate, the second guard region being of the second conductivity type and is biased by a second supply voltage terminal, the second guard region including a portion located directly laterally between the guard region and the first region.

7. The semiconductor circuitry of claim 6 wherein the second supply voltage terminal is biased at a ground voltage.

8. The semiconductor circuitry of claim 1 wherein the first region is characterized as a drain for a FET.

9. The semiconductor circuitry of claim 1 wherein the first region is characterized as an electrode of a capacitor.

10. The semiconductor circuitry of claim 1 wherein the diode circuit is implemented with a MOSFET that has a diode configuration.

11. The semiconductor circuitry of claim 1 wherein the diode circuit is implemented with a bipolar transistor that has a diode configuration.

12. The semiconductor circuitry of claim 1 wherein the diode circuit is implemented with a fourth region of the integrated circuit substrate located in the guard region, the fourth region is of the second conductivity type.

13. The semiconductor circuitry of claim 1 wherein the guard region includes a buried layer located directly underneath the first region.

14. The semiconductor circuitry of claim 13 wherein the second region separates the first region from the buried layer.

15. The semiconductor circuitry of claim 1 wherein the diode circuit includes regions located in the integrated circuit substrate.

16. The semiconductor circuitry of claim 1 wherein the supply voltage terminal and the guard region supply current to the signal terminal when a negative voltage is applied to the signal terminal during a negative current injection test.

* * * * *